(12) United States Patent
Feger et al.

(10) Patent No.: US 7,981,849 B2
(45) Date of Patent: Jul. 19, 2011

(54) REVERSIBLE THERMAL THICKENING GREASE

(75) Inventors: Claudius Feger, Poughkeepsie, NY (US); Jeffrey D. Gelorme, Burlington, CT (US); Sushumna Iruvanti, Wappingers Falls, NY (US); Rajneesh Kumar, Poughkeepsie, NY (US); Ijeoma M. Nnebe, Ossining, NY (US)

(73) Assignee: International Business Machines Corporation, Yorktown Heights, NY (US)

( * ) Notice: Subject to any disclaimer, the term of this patent is extended or adjusted under 35 U.S.C. 154(b) by 1167 days.

(21) Appl. No.: 11/683,825

(22) Filed: Mar. 8, 2007

(65) Prior Publication Data

US 2008/0220998 A1   Sep. 11, 2008

(51) Int. Cl.
*C10M 145/24* (2006.01)
*C10M 145/22* (2006.01)
*C10M 145/14* (2006.01)
*C10M 143/00* (2006.01)
*C10M 125/04* (2006.01)
*C10M 125/10* (2006.01)
*C10M 125/20* (2006.01)

(52) U.S. Cl. ........ 508/591; 508/512; 508/486; 508/150; 508/165

(58) Field of Classification Search .................. 508/111, 508/591, 512, 486, 150, 165
See application file for complete search history.

(56) References Cited

U.S. PATENT DOCUMENTS 3,243,369 A * 3/1966 Dekking ..................... 508/136
7,626,251 B2 * 12/2009 Lu et al. ...................... 257/675

* cited by examiner

*Primary Examiner* — Glenn Caldarola
*Assistant Examiner* — Jim Goloboy
(74) *Attorney, Agent, or Firm* — Connolly Bove Lodge & Hutz LLP; Daniel P. Morris, Esq.

(57) ABSTRACT

A reversible thermal thickening grease for microelectronic packages, in which the grease contains filler particles; at least one polymer; and a binder; in which the filler particles are dispersed within the binder, in which one or more segments of the at least one polymer may be attached to the filler particles prior to dispersion in the binder, and in which the polymer collapses at temperatures below a Theta temperature and swells at temperatures above a Theta temperature. During the operation of a microelectronic package, grease pump-out and air proliferation are minimized with use of the reversible thermal thickening grease, while grease fluidity is retained under repetitive thermal stresses.

15 Claims, 3 Drawing Sheets

(i)

(ii)

(i)

(ii)

(i)

(ii)

(i)

(ii)

REVERSIBLE THERMAL THICKENING GREASE

BACKGROUND

1. Technical Field

The disclosure relates to a reversible thermal thickening grease, especially for microelectronic packages, a method of making the reversible thermal thickening grease, and a microelectronic package containing the reversible thermal thickening grease. In particular, the disclosure relates to a reversible thermal thickening grease for microelectronic packages, in which the grease contains filler particles and a binder, in which one or more segments of at least one polymer may be attached to surfaces of the particles and/or included in the grease without attachment, such that the fluidity of the grease minimizes grease pump-out that leads to air in the chip-heat sink interface.

2. Discussion of the Background

Thermal greases have been used extensively for microelectronic flip-chip packages as thermal interface materials (TIMs) with a two-fold objective:

(i) to improve conduction of heat away from the chip; and (ii) to provide a compliant interface that will accommodate thermal expansion mismatches between the various materials in the package.

A flip-chip package may conventionally include a direct electrical connection of a face down ("flipped") electronic circuit chip onto a substrate having electrical conductors, such as a ceramic substrate, circuit board, or carrier using conductive solder bumps formed in a ball grid array on bond pads of the chip. A TIM is disposed on an upper side of the electronic circuit chip, in which a substantially flat thermally conductive lid is disposed over the chip and in thermal contact with the interface material. In particular, the TIM is located in the gap between the chip and the lid for transmitting heat generated from the chip to the lid.

Thermal grease TIMs, also referred to as thermal pastes consist of a metal or other highly conductive (thermal) solid fillers in an organic binder. They are specifically formulated to exhibit fluid responses under external stresses to minimize contact resistance and accommodate system stresses. As the flip-chip package continues to evolve, in terms of substrates used (ceramic vs. organic), chip operating power etc., these greases are being subjected to larger thermal and mechanical stresses that exacerbate their degradation over time.

In particular, thermal greases are subject to being pumped out of the gap with the repetitive expansion and contraction of the package that occurs with thermal excursions. During its active state, the chip temperature increases leading to an overall rise in the package temperature and thermal expansion of various materials in the package with a net confinement pressure exerted on the grease. Once this confinement pressure is greater than the grease yield stress, the grease is forced to flow to regions of lower pressure i.e., the edges. This flow is exacerbated by a decrease in the binder viscosity with increased temperature. Depending on the relative ratio of capillary to viscous forces, some of the binder may be drained from the interstitial pores during this process. When the chip and package cools during chip idle or off state, the package contracts and there is a negative pressure in the gap that results in the grease flow back into the gap. However, as the temperature decreases, the binder viscosity increases such that the amount of grease that flows back into the gap is less than that which flowed out. Air occupies areas devoid of grease and may also displace the binder in the grease. With repeated heating and cooling cycles, most of the grease can be pumped out of the chip-heat sink interface. This effect is commonly referred to as grease pump-out which negatively impacts heat removal from the package.

Greases have been used successfully in ceramic packages with few major degradation concerns due to the low thermal expansion mismatch between the ceramic substrate and other materials in the package. However, as the industry moves towards organic packages, in an effort to reduce the package cost, a stable TIM is needed to withstand the large compressive and shear forces encountered in these packages. Currently, there are no known methods or strategies of minimizing grease pump-out while retaining the grease fluidity with repetitive thermal stresses. However, new strategies exist such as the formulation of greases that can be crosslinked at high temperature into permanent gels after compression to the desired bondline during package assembly.

Though these gels overcome the problems associated with grease pump-out, the absence of fluidity in the system negatively impacts stress accommodation by the TIM. It is commonly observed that gel TIMs fracture with tensile loading during package contraction in the cooling phase of the thermal cycle. In view of the foregoing, there remains a need for a TIM such as a grease with an improved overall performance in microelectronic packages, in which the problems of grease pump-out and subsequent air proliferation are reduced or eliminated.

SUMMARY

Accordingly, the following embodiments provide for the minimization of grease pump-out in a microelectronic package by improving the fluid properties through reversible thermal thickening. For instance, when temperature increases the grease becomes a pseudo-gel or highly viscous matrix, and when temperature decreases it recovers its original fluidity. Thus, at high microelectronic package temperatures when the grease is subjected to a compressive force, flow is minimized by an increase in the grease viscosity, while at low temperatures when decompression occurs, the grease reverts back to a fluid that can readily respond to the widening gap.

One embodiment provides a reversible thermal thickening grease for microelectronic packages, the grease comprising:

filler particles;

at least one polymer, wherein one or more segments of the at least one polymer is attached to a surface of at least a portion of the filler particles; and a binder;

wherein the filler particles are dispersed within the binder, wherein the one or more segments of the at least one polymer is attached to the surface of the filler particles prior to dispersion of the filler particles in the binder, and wherein the polymer collapses at temperatures below a Theta temperature from about 30° C. to about 60° C. and swells at temperatures above a Theta temperature from about 30° C. to about 60° C.

Another embodiment provides a reversible thermal thickening grease for microelectronic packages, the grease comprising:

filler particles;

at least one polymer; and a binder;

wherein the filler particles and the at least one polymer are dispersed within the binder, and wherein the at least one polymer collapses at temperatures below a Theta temperature from about 30° C. to about 60° C. and swells at temperatures above a Theta temperature from about 30° C. to about 60° C.

Another embodiment provides a method of making the reversible thermal thickening grease for a microelectronic package described above, the method comprising:

attaching the at least one polymer to a surface of at least a portion of the filler particles; and adding the filler particles to the binder to form the reversible thermal thickening grease.

Another embodiment provides a method of making the reversible thermal thickening grease for a microelectronic package described above, the method comprising:

adding the filler particles to the binder; and separately adding the at least one polymer to the dispersion of the binder and filler particles to form the reversible thermal thickening grease.

A further embodiment provides a microelectronic package comprising:

a substrate;

an underfill material;

an electronic chip;

a flat thermally conductive heat spreader or sink; and a layer of the reversible thermal thickening grease, wherein the layer of the reversible thermal thickening grease is disposed on an upper side of the electronic circuit chip, and wherein a flat thermally conductive lid is disposed over the chip and in thermal contact with the layer of the reversible thermal thickening grease.

The above-embodiments highlight certain aspects of the reversible thermal thickening grease. However, additional embodiments are found in the following description of the drawings and detailed description.

BEST AND VARIOUS MODES FOR CARRYING OUT DISCLOSURE

Figure 1A:
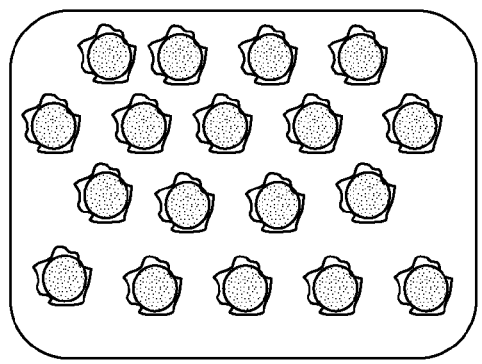
FIG. 1A is an illustration of the thermal grease, formulated with a functional polymer attached to the solid fillers that collapses at temperatures below the Theta temperature and swells at temperatures above the Theta temperature.
Figure 1A:
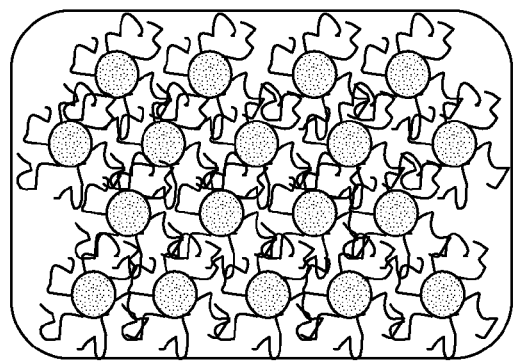

A more complete appreciation of the disclosure and many of the attendant advantages will be readily obtained, as the same becomes better understood by reference to the following detailed description when considered in connection with the accompanying drawings.

The filler particles used in the reversible thermal thickening grease ("thermal grease") may be solid and formed of any shape. For example, the filler particles may be solid, may vary in size, and may be spheres, platelets, flakes, and/or fibers. The filler particles may also be ceramic, metallic, or carbon-based. For example, the filler particles may include, but are not limited to, silicon fillers, gold fillers, aluminum fillers, silver fillers, metal oxide fillers, metal nitride fillers, silicon carbide fillers, diamond fillers, carbon nanotube fillers, graphite fiber fillers, or combinations thereof. The volume fraction of the filler particles in the thermal grease may range from about 0.6 to about 0.9.

The polymer used in the thermal grease is a thermosensitive polymer, which may include homopolymers, copolymers, or combinations thereof. One or more segments of the polymer may or may not be attached to at least a portion of the filler particles in the thermal grease, in which the portion may include, but is not limited to, surfaces of at least 10% of the filler particles in the thermal grease.

The polymer may include, but are not limited to, polysiloxanes, polystyrenes, polyacrylates, polyamides, polyethers, polyesters, polyolefins, and combinations thereof having a molecular weight greater than 1000 g/mol and comprising a volume fraction of 0.1 to 1% of the binder volume fraction. The molecular weight can be adjusted for a Theta temperature for a specific thermosensitive polymer-binder pair.

In a preferred embodiment, when the copolymer is a block copolymer, one block of the copolymer, attached and nearest to each particle surface, collapses at temperatures below a Theta temperature from about 30° C. to about 60° C. and swells at temperatures above a Theta temperature from about 30° C. to about 60° C., while the other block of the copolymer, attached to each particle surface but furthest from each particle surface, is in a collapsed state at all temperatures from about 15° C. to about 200° C. Exemplary monomers include, but are not limited to, acrylates, acrylamides, vinyl ethers, vinyl esters, siloxanes, linear and branched olefins, and styrene for the swellable block and carboxylic acid derivatives for the permanently collapsed block.

The binder may be any conventional binder material that is compatible with the thermal grease. For example, the binder may be an organic binder and/or an insulating non-aqueous liquid having low viscosity. The term "compatible" should be taken to mean that the binder utilized will not interfere with the other components of the grease. The binder may also include, but is not limited to, paraffinic hydrocarbons, silicone oils, glycerides, halogenated hydrocarbons, olefinic hydrocarbons, aromatic hydrocarbons, polyglycols, or combinations thereof. Exemplary monomers include, but are not limited to, ethyl and butyl methacrylates for glycol and olefin binders, and alkyl acrylamides for silicone binders.

The molecular weight of the binder is generally 200 to 1000 g/mol, which depends on the required viscosity of the binder. The volume fraction of the binder in the thermal grease may range from about 0.1 to about 0.4, which is based on the volume fraction of the filler particles.

Figure 1B:
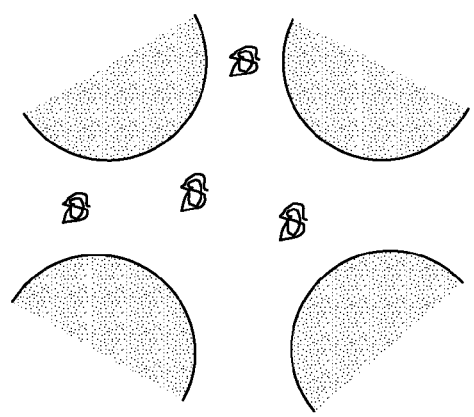
FIG. 1B is an illustration of the thermal grease, in which the binder is modified with a polymer that collapses at temperatures below the Theta temperature and swells at temperatures above the Theta temperature.
Figure 1B:
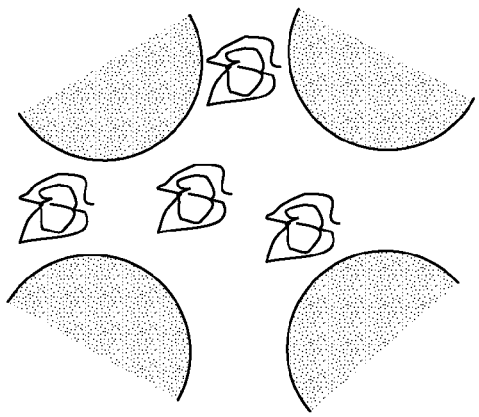

FIG. 1 generally illustrates the basic premise of the thermal grease. The polymer(s) is used to control the effective viscosity of the fluid phase, such that it is either invariant with changes in temperature, or reversibly switches between a low and high viscosity state at low and high temperatures. The following four embodiments control the effective viscosity of the fluid state:

(a) modification of the solid fillers with a polymer that swells or collapses, with this transition occurring within a temperature range of interest relevant to both the chip operating temperature and the viscosity-temperature relationship of the binder, as shown in FIG. 1A; or (b) modification of the solid fillers with a block copolymer in which one block swells while the other block remains in a collapsed state, with this transition occurring within a temperature range of interest relevant to both the chip operating temperature and the viscosity-temperature relationship of the binder; or (c) modification of the binder with a polymer that swells or collapses, with this transition occurring within a temperature range of interest relevant to both the chip operating temperature and the viscosity-temperature relationship of the binder, as shown in FIG. 1B; or (d) modification of the binder with a block copolymer in which one block swells while the other block remains in a collapsed state, with this transition occurring within a temperature range of interest relevant to both the chip operating temperature and the viscosity-temperature relationship of the binder.

In particular, the thermal grease, specially formulated with a functional polymer or copolymer (a) attached to the solid fillers (shown as spherical particles) or (b) included in the binder (solid fillers shown as shaded region) in which one block or the whole polymer, (i) collapses at temperatures below the Theta temperature and (ii) one block or the whole polymer swells at temperatures above the Theta temperature thereby modifying the fluid properties of the grease. Therefore, due to the above-formulation, the thermal grease becomes a pseudo-gel or highly viscous matrix when temperature increases above 40° C., and the grease recovers its original fluidity when temperature decreases below 40° C.

This thermoreversible property of the thermal grease exploits the temperature dependence of the solubility of polymers, which arises from the relative strength of intramolecular (monomer-monomer) interactions versus the intermolecular (monomer-solvent or monomer-polymer for binary polymer mixtures) interactions that varies with temperature. When the energy of the intramolecular interaction is equal to the intermolecular interaction, this is defined as the Theta condition and the temperature at which this occurs is called the Theta or Flory temperature. Below the Theta temperature, the intermolecular interactions become less favorable and the polymer shrinks. Correspondingly, the polymer's solubility decreases and self-association is favored.

Conversely, at temperatures above the Theta temperature, the polymer becomes more soluble and swells. The Theta temperature can be characterized from the change in the effective radius of the shrunk versus swollen polymer with temperature changes via various experimental methods, include light scattering, x-ray scattering, neutron scattering, and rheometry. The Theta temperature can also be termed the Upper Critical Solution Temperature (UCST) of the polymer-solvent pair. Commonly, in binary polymer mixtures, a second critical solution point is observed with further increase in temperature that is called the Lower Critical Solution Temperature (LCST). Here, the solubility of the polymer decreases again once the LCST is exceeded. The UCST and LOST envelope is usually studied to analyze the miscibility of polymer blends.

Specific to the disclosure, at temperatures below the Theta temperature when polymer-binder interactions are less favorable than the monomer-monomer interactions, the polymer remains/reverts to a collapsed state in the binder or on the particles. In the case where the polymer is attached to the solid filler, in the collapsed state it imparts purely dispersive properties in the grease. In the case where the polymer is included in the binder, and not attached to the filler, it is assumed that in the collapsed state it imparts a minimal increase in the viscosity of the binder.

In both embodiments, at temperatures above the Theta temperature when polymer-binder interactions become more favorable than the monomer-monomer interactions, the polymer swells into the binder thereby counteracting the native drop in binder viscosity. This results in either a constant overall fluid phase viscosity with temperature or an increasing overall fluid phase viscosity with temperature, e.g., FIG. 1B(ii). The polymer may further interact with neighboring chains to create a highly viscous network, e.g., FIG. 1A(ii), or pseudo-gel via associative interactions or chain entanglement. In the case of a block copolymer, above the Theta temperature one block swells (exhibits an UCST), while the other block remains in a collapsed state (exhibits an LCST). Due to the disfavored solubility of the second block it will self associate or associate with other identical monomers from neighboring copolymers. This association will result in pseudo-gelation of the grease. When the filler particles are modified with such a copolymer, the self-associating block is the outer block, i.e. furthest from the particle surface.

Figure 2A:
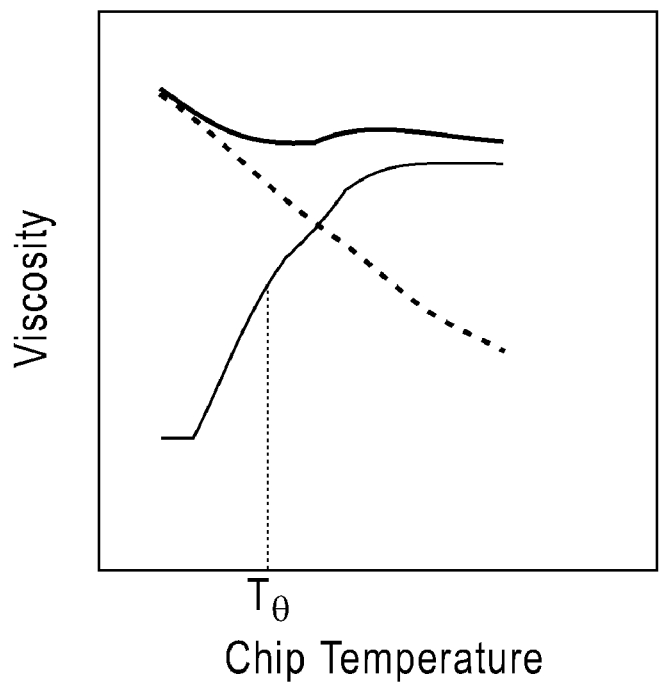
FIG. 2A is an illustration of the changes in viscosity of components of the fluid phase in the thermal grease.

FIG. 2A illustrates the concept of producing an invariant fluid phase viscosity with temperature when a polymer or copolymer additive that swells with increased temperature is added to a typical binder used in thermal greases. Though most of the synthetic binders selected to be used in thermal greases have high viscosity indices (VI), i.e. show lesser variation in viscosity with temperature than natural lubricants, they still exhibit a significant drop in viscosity at temperatures relevant to the chip operating temperatures in microelectronic packages. To combat this drop in viscosity, a polymer can be added to the binder with a Theta temperature that lies between the minimum and maximum temperatures of the package, such that the polymer swells at higher temperatures and negates the drop in viscosity of the binder.

The changes in viscosity of components of the fluid phase in the thermal grease shown in FIG. 2A are as follows: binder (dashed line), polymer additive (solid line), and binder with polymer additive (gray line).

Figure 2B:
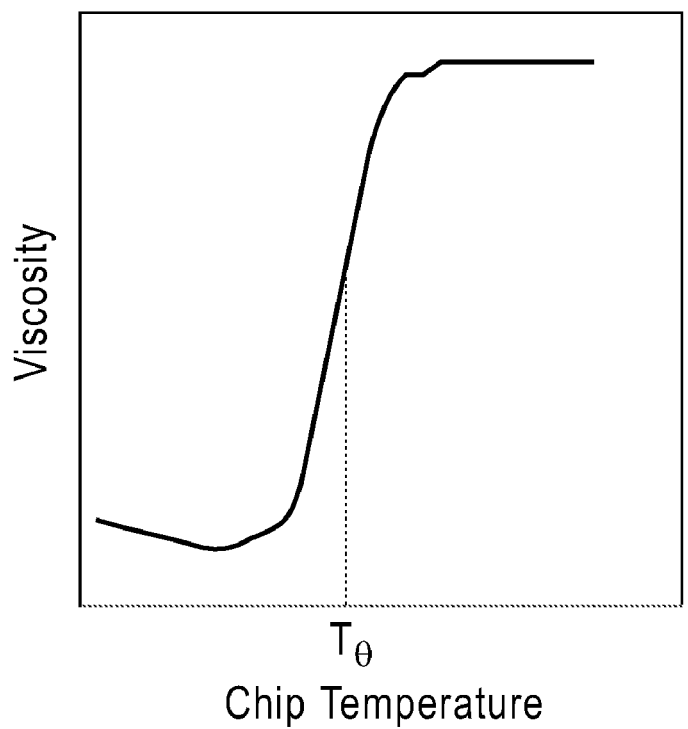
FIG. 2B is an illustration of the changes in the thermal grease viscosity in relation to chip temperature.

FIG. 2B illustrates the expected fluid to "gel" transition with temperature in the second embodiment of the thermoreversible thermal grease. Specifically, with initial chip temperature rise, the grease viscosity will go down, as with conventional greases and moderate flow will occur, until the surface-attached polymer starts to transition from a collapsed state to a swollen state at a temperature slightly below the polymer-binder Theta temperature. With the gradual swelling of the polymer, the grease viscosity will increase until the polymer reaches a full swollen state and starts to interact with its neighboring chains, via non-covalent interactions such as hydrogen bonding or self-association or physical entanglement. At this point, the viscosity of the grease will approach a plateau value indicative of pseudo-gel formation.

Commonly, the junction temperature (temperature at the chip) especially lies anywhere from about 65° C. to about 100° C. A polymer-binder combination is chosen such that the Theta temperature of the polymer or one block of a copolymer in that binder is from about 30° C. to about 60° C. Though most greases have a yield stress around 1 kPa resulting in induced flow almost immediately with heating, the temperature range is chosen such that the fluid-gel transition occurs at a temperature at which there is only moderate grease flow due to the confinement pressure and a moderate decrease in the viscosity of the binder. The exact chosen Theta temperature typically depends on (i) the viscosity index of the binder and (ii) the rheological properties of the filler-binder system in the absence of the functional polymer, which in itself is dependent on the fillers used, the filler loading, filler size distribution, and the viscosity of the binder.

The table, as provided below, is an example of the calculated acceptable molecular weight range of the functional polymer based on several values of average pore diameter in the grease using the assumption that the polymers have linear, flexible chains. The average pore diameter referred to is defined as the average diameter of the void spaces between the solid fillers if these spaces are approximated as spherical. To achieve chain overlap or chain proximity for non-covalent associative interactions, it is desirable that the Flory radius of the polymer chains in their swollen state is at least one quarter of the average pore diameter. Based on this criterion, the average molecular weight of the polymers to be attached to the filler surfaces for associative interactions or entanglement to occur has been estimated for different average pore diameters, which can be correlated with solid volume loading with an appropriate model that takes into account the solid filler geometry and size distribution.

TABLE 1

| Average Pore Diameter (nm) | Polymer MW ($10^6$ g/mol) |
|---|---|
| 250 | 0.20 |
| 300 | 0.25 |
| 400 | 0.40 |

From scaling theory, the Flory radius $R_F$ of a fully expanded polymer chain is defined as:

$$R_F = a_F n^{3/5}$$

where $a_F$ is the characteristic monomer length and n is the monomer number. The molecular weight of the polymer can then be calculated knowing the monomer molecular weight. In the calculation used for Table 1, $a_F$ was assumed to be 1 nm and the monomer molecular weight was assumed to be 140 g/mol, and it was desired for $R_F$ to be 60% of the average pore radius. It is important to know that this scaling law applies to the dilute regime, where segments from neighboring chains do not overlap. To achieve this, the spacing between attachment points of the polymer chains on the filler surface should be much larger than the polymer Flory radius at the Theta condition.

At the other conditions (Theta and poor solvent), the Flory radius still scales by a power law with the monomer number except with a different exponent. At the Theta condition, the exponent is ½, while in the collapsed state, the exponent is ⅓. The characteristic monomer length may also differ slightly with temperature changes, depending on the strength of the short-range interactions between segments on the same polymer. Assuming a polymer molecular weight (MW) of $0.2 \times 10^6$ g/mol, the polymer size should vary from a collapsed Flory radius of 11 nm, to a Theta radius of 37 nm, and an expanded radius of 75 nm, thereby occupying 9% of the pore space in the collapsed state, 30% in the Theta state, and 60% in the swollen or expanded state. From these numbers, it should be clear that as the Theta state is approached, the viscosity of the grease will increase as the polymer expands into the porous space.

The above-discussion centers around creating a pseudo-gel at high temperatures achieved through non-covalent associative interactions between chains in close proximity, i.e., when polymers are in the swollen state. However, the disclosure also embodies the creation of a highly viscous network to minimize flow at high temperatures that can be obtained by exploiting the same polymer swelling characteristics with temperature. In this case, lower molecular weight (5000 to 20,000 g/mol) polymers can be used to increase the local viscosity of the mobile phase in the interporous regions. The use of lower molecular weight polymers is beneficial in preserving close interfiller spacing for optimal thermal conductivity at high temperatures. In addition, a low graft density of the polymers on the filler surfaces can be exploited to also preserve interfiller proximity.

Figure 3A:
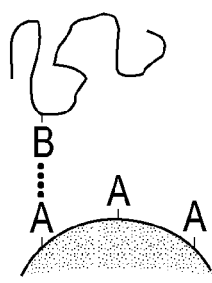
FIG. 3 is an illustration of the various methods of attaching polymers to the surface of filler particles.
Figure 3B:
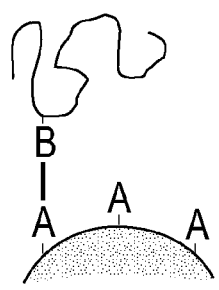
Figure 3C:
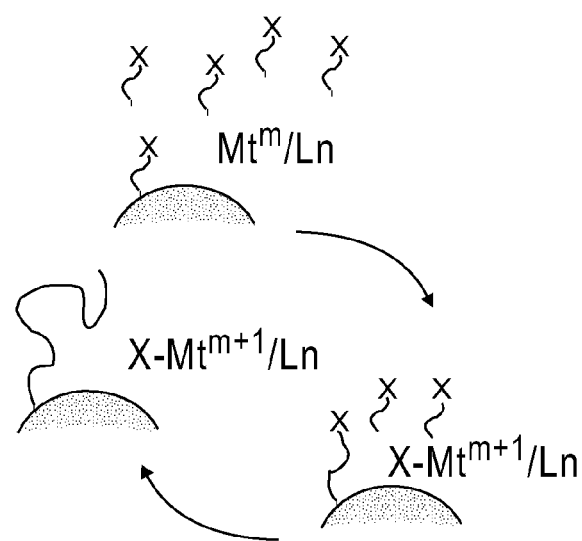

FIG. 3 illustrates an embodiment of the disclosure, in which various methods are used to attach polymers to a surface that can be used to functionalize the solid fillers in the grease with thermoresponsive polymers. There are three main methods of polymer attachment to a surface: (a) attachment via non-covalent interactions between a functional group(s) on the polymer and surface groups; (b) attachment via a covalent bond between a functional group(s) on the polymer and surface groups; and (c) direct growth of the polymer using site-directed polymerization.

In the case of non-covalent attachment (a), attachment can be mediated via electrostatic, van der Waal, and hydrogen bonding interactions. Attachment can also be mediated by segment attachment, as with certain diblock copolymers where one block may preferentially adsorb to the surface to minimize unfavorable interactions with the solvent. For covalent attachment (b), which is the preferred method, polymers with surface-reactive groups can be utilized, such as polysiloxanes with silicon fillers, thiol functionalized polymers with gold and other metal fillers, and polyalkyl acids with metal oxide fillers. Alternatively, polymers can be directly polymerized onto the solid filler using processes such as Atom Transfer Free Radical Polymerization (ATRP), as shown in (c). In ATRP, polymerization occurs via transfer of a halogen atom (X) between a growing polymer and metal-ligand complex ($Mt^{m+1}/Ln$), and is an established method of controlled polymerization capable of producing polymers with a broad range of molecular weights. The thermal grease embodies the functionalization of any percentage (greater than 0%) of the solid fillers or binder to achieve a low viscosity grease at temperatures below 40° C. and a high viscosity grease or temporary gel at higher temperatures.

The thermal grease may also be provided as a layer in any conventional microelectronic package. For instance, the microelectronic package may generally include a substrate; an underfill material, an electronic chip; a flat thermally conductive heat spreader or sink; and a layer of the reversible thermal thickening grease, in which the layer of the reversible thermal thickening grease is disposed on an upper side of the electronic circuit chip, and in which a flat thermally conductive heat spreader or heat sink is disposed over the chip and in thermal contact with the layer of the reversible thermal thickening grease. In a preferred embodiment, the microelectronic package a flip chip microelectronic package, in which there is a direct electrical connection of a face down electronic circuit chip onto the substrate.

Obviously, numerous modifications and variations of the disclosure are possible in light of the above disclosure. It is therefore understood that within the scope of the appended claims, the disclosure may be practiced otherwise than as specifically described herein.

What is claimed is:

1. A reversible thermal thickening grease, the grease comprising:
    filler particles;
    at least one polymer, wherein one or more segments of the at least one polymer is attached to a surface of at least a portion of the filler particles; and
    a binder;
    wherein the filler particles are dispersed within the binder,
    wherein the one or more segments of the at least one polymer is attached to the surface of the filler particles prior to dispersion of the filler particles in the binder, and
    wherein the polymer collapses at temperatures below a Theta temperature from about 30° C. to about 60° C. and swells at temperatures above a Theta temperature from about 30° C. to about 60° C., and at least one selected from the group consisting of a volume fraction of the filler particles ranging from about 0.6 to about 0.9 and a volume fraction of the binder ranging from about 0.1 to about 0.4.

2. The reversible thermal thickening grease according to claim 1, wherein the grease becomes a pseudo-gel or highly viscous matrix when the temperature increases above 40° C., and the grease recovers its original fluidity when the temperature decreases below 40° C.

3. The reversible thermal thickening grease according to claim 1, wherein the at least one polymer is attached to a surface of at least 10% of the filler particles.

4. The reversible thermal thickening grease according to claim 1, wherein the polymer is selected from the group consisting of a homopolymer, a copolymer, and combinations thereof.

5. The reversible thermal thickening grease according to claim 4, wherein the copolymer is a block copolymer, wherein one block of the copolymer, attached and nearest to each particle surface, collapses at temperatures below a Theta temperature from about 30° C. to about 60° C. and swells at temperatures above a Theta temperature from about 30° C. to about 60° C., while the other block of the copolymer, attached to each particle surface but furthest from each particle surface, is in a collapsed state at all temperatures from about 15° C. to about 200° C.

6. The reversible thermal thickening grease according to claim 1, wherein the filler particles are selected from the group consisting of spheres, platelets, flakes, fibers, and combinations thereof.

7. The reversible thermal thickening grease according to claim 1, wherein the filler particles are selected from the group consisting of ceramic, metallic, carbon materials, and combinations thereof.

8. The reversible thermal thickening grease according to claim 1, wherein the filler particles are selected from the group consisting of silicon fillers, gold fillers, aluminum fillers, silver fillers, metal oxide fillers, metal nitride fillers, silicon carbide fillers, diamond fillers, carbon nanotube fillers, graphite fiber fillers, or combinations thereof.

9. The reversible thermal thickening grease according to claim 1, wherein the polymer is selected from the group consisting of polysiloxanes, polystyrenes, polyacrylates, polyamides, polyethers, polyesters, polyolefins and combinations thereof having a molecular weight greater than 1000 g/mol.

10. The reversible thermal thickening grease according to claim 1, wherein the binder is selected from the group consisting of paraffinic hydrocarbons, silicone oils, glycerides, polyglycols, halogenated hydrocarbons, olefinic hydrocarbons, aromatic hydrocarbons, and combinations thereof.

11. A method of making the reversible thermal thickening grease according to claim 1, the method comprising:
    attaching the at least one polymer to a surface of at least a portion of the filler particles; and
    adding the filler particles to a binder to form the reversible thermal thickening grease.

12. The method according to claim 11, wherein the polymer is attached to the surface of the filler particles by non-covalent interactions between a functional group(s) on the polymer and surface groups.

13. The method according to claim 11, wherein the polymer is attached to the surface of the filler particles by a covalent bond between a functional group(s) on the polymer and surface groups.

14. The method according to claim 11, wherein the polymer is attached to the surface of the filler particles by direct growth of the polymer using site-directed polymerization.

15. A microelectronic package comprising:
    a substrate;
    an underfill material;
    an electronic chip;
    a flat thermally conductive heat spreader or sink; and
    a layer of the reversible thermal thickening grease according to claim 1,
    wherein the layer of the reversible thermal thickening grease is disposed on an upper side of the electronic circuit chip, and
    wherein a flat thermally conductive lid is disposed over the chip and in thermal contact with the layer of the reversible thermal thickening grease.

* * * * *